United States Patent [19]

Moore

[11] 4,321,321

[45] Mar. 23, 1982

[54] METHOD OF PRODUCING COLOR SEPARATION NEGATIVES USING CONTRAST REDUCING FILTER

[76] Inventor: Joseph E. Moore, Rte. 8, Box 91, Northport, Ala. 35476

[21] Appl. No.: 204,995

[22] Filed: Nov. 7, 1980

[51] Int. Cl.³ .............................................. G03C 5/04
[52] U.S. Cl. .................................. 430/356; 430/396; 430/962
[58] Field of Search .................. 430/4, 22, 30, 356, 430/360, 396, 397, 962

[56] References Cited

U.S. PATENT DOCUMENTS

| | | | |
|---|---|---|---|
| 2,203,652 | 6/1940 | Ehrenfried | 430/356 |
| 3,160,504 | 12/1964 | Montani | 430/396 |
| 3,272,646 | 9/1966 | Chopoorian et al. | 430/962 |
| 3,442,648 | 5/1969 | Smith | 430/397 |
| 4,028,105 | 6/1977 | Ono et al. | 430/396 |

Primary Examiner—J. Travis Brown
Attorney, Agent, or Firm—Harvey B. Jacobson

[57] ABSTRACT

An initial step of inspecting a positive color transparency is performed to determine the darkest detail area thereof to be reproduced and is subsequently followed by the superposing of the positive color transparency on a panel of photochromic (light sensitive) glass to form a laminate-type assembly. Thereafter, the assembly has a beam of light directed therethrough from the transparency side thereof. The beam intensity and the duration of illumination is sufficient to cause the more heavily illuminated portions of the glass panel to darken. Thereafter, trial enlarger exposing of a trial color separation negative film sheet through the assembly and a half-tone screen with sufficient light determined to properly expose the area of the trial negative film sheet corresponding to the prior mentioned darkest detail area of the transparency is accomplished. Then, the trial negative film sheet is developed with sufficient developing time and developer strength to achieve the desired "dot size" in the aforementioned corresponding area of the negative as well as in the lighter detail areas thereof. If sufficient detail of the aforementioned corresponding area is not brought out, a greater exposure time is allowed during exposure of a subsequent trial color separation negative film sheet, or a higher intensity light or greater time of illumination is used when initially illuminating the laminate-type assembly. Thereafter, the actual color separation negatives to be utilized are produced using the same exposure time and developing steps.

5 Claims, 3 Drawing Figures

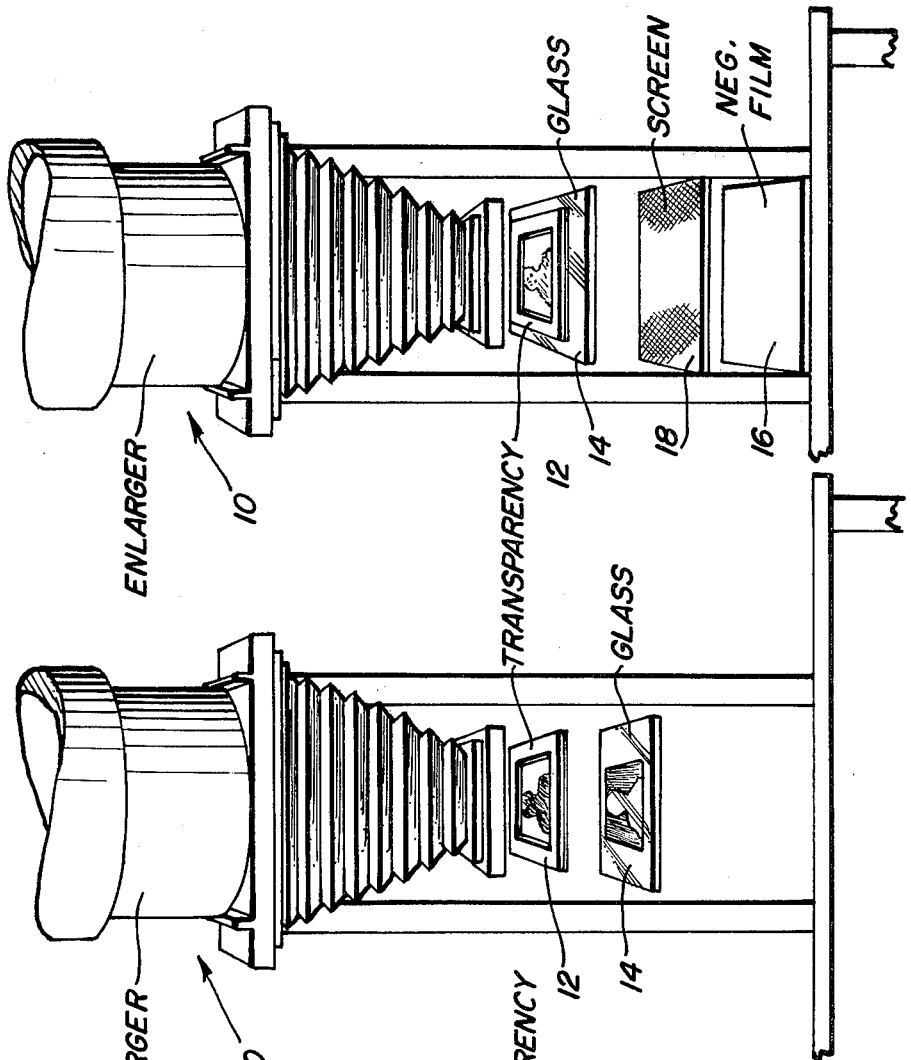
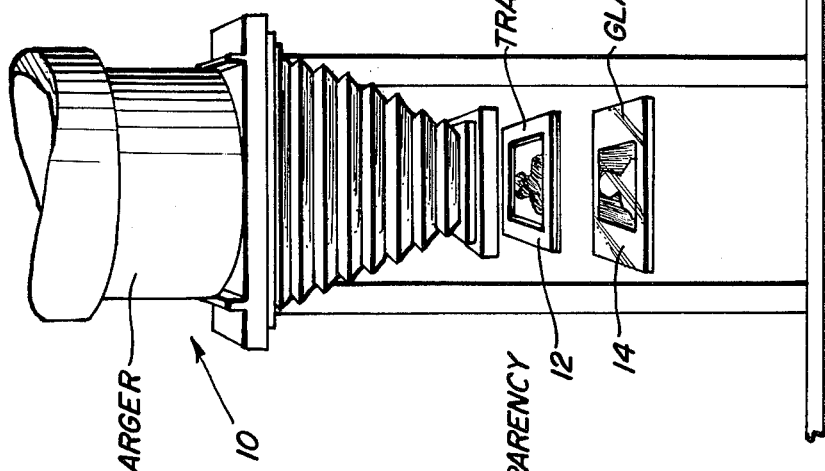
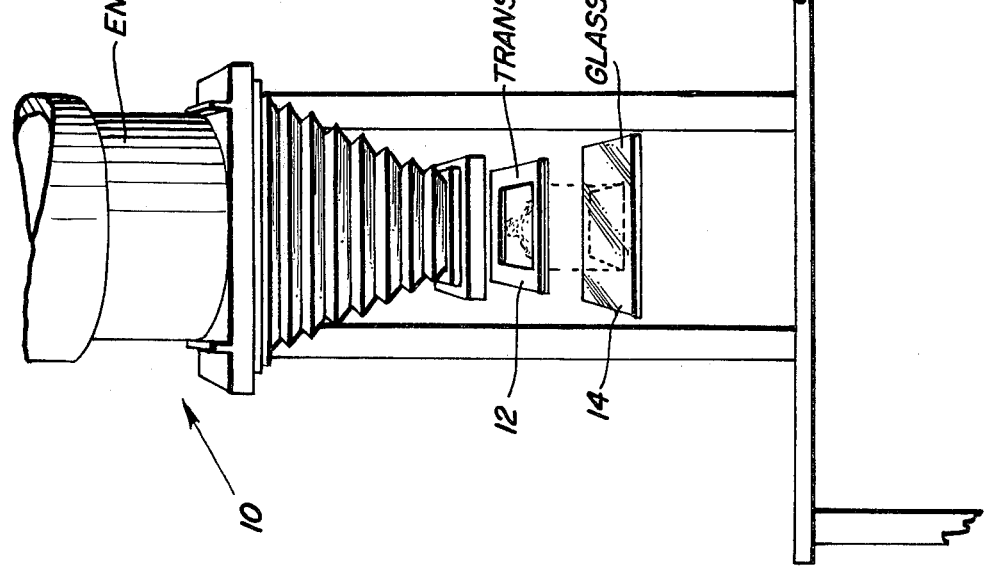

METHOD OF PRODUCING COLOR SEPARATION NEGATIVES USING CONTRAST REDUCING FILTER

BACKGROUND OF THE INVENTION

Color separation negatives for color printing reproduction of a positive color transparency are presently produced through the utilization of half-tone screens and continuous tone negative transparency masks. The maximum density range of most original transparencies is greater than can be reproduced with paper and inks. Therefore, the density range is reduced by making a continuous tone negative of the transparency on film and is called a mask. When placed in registry, the density range of the image projected is reduced to the range most papers and inks can print. Although this process is well-known and established, superlative results may not always be obtained without "flashing" or "bumping" and the use of a continuous tone negative transparency mask requires special skills which are learned, for the most part, through extensive schooling and at a great expense. Further, although large newspapers have sufficient quantity of color printing to warrant the salary of an experienced person for color separation work, smaller newspapers, for example, do not have a large enough color printing load to warrant the salary of such a specialized person.

In addition, the use of a continuous tone negative transparency mask when preparing color separation negatives inherently involves at least some misalignment of the mask and the color positive transparency to be reproduced, even though locating pins may be utilized, and the sharpness of edges between closely adjacent high and low density areas of the positive color transparency is reduced, at least to some degree.

Accordingly, a need exists for a method of preparing color separation negatives for color printing which does not require the use of a continuous tone negative transparency mask.

BRIEF DESCRIPTION OF THE INVENTION

The method of the instant invention by-passes the previously required step of utilizing a negative transparency mask by using a photochromic (sensitive) glass panel as a substitute for the negative transparency mask. The positive color transparency to be reproduced is superposed over the glass panel to form a laminate-type assembly and the assembly thereafter has a beam of light directed therethrough from the transparency side thereof. The beam intensity and the time of duration of the beam of light are determined such that the more heavily illuminated portions of the glass panel are darkened. Thus, the areas of the glass panel corresponding to the less dense areas of the positive color transparency are darkened while the area of the glass panel corresponding to the more dense areas of the positive color transparency remain substantially unaffected. After the desired darkening of the glass panel has been achieved, the assembly is then placed in an enlarger and utilized, in conjunction with a half-tone screen to expose a negative film sheet. Because the positive color transparency and the darkened glass panel are used in the exposing of the negative film sheet, the contrast of the image on the negative film sheet is reduced to enable greater exposure of those portions of the negative film sheet corresponding to the more dense areas of the positive film transparency, without over-exposing those portions of the negative film sheet corresponding to the less dense areas of the positive color transparency.

The method of the instant invention need not involve the compression of the midrange tones due to the availability of various darkened densities of photochromic glass panels.

The main object of this invention is to provide a method of producing color separation negatives with reduced contrast and without involving the utilization of continuous tone negative transparency masks.

Another important object of this invention is to provide a method of producing color separation negatives which will substantially eliminate the need for "flashing" and "bumping".

Another important object of this invention is to provide a method of producing color separation negatives which will more fully and consistently produce negatives which are spectroscopically correct.

A very important object of this invention is to provide a method of producing color separation negatives involving considerably less time and requiring a considerably lesser degree of skill than similar methods requiring the use of a mask.

A final object of this invention to be specifically enumerated herein is to provide a method of producing color separation negatives which may be economically carried out even though it may be used only occasionally.

These together with other objects and advantages which will become subsequently apparent reside in the details of construction and operation as more fully hereinafter described and claimed, reference being had to the accompanying drawings forming a part hereof, wherein like numerals refer to like parts throughout.

BRIEF DESCRIPTION OF THE DRAWINGS

FIG. 1 is a schematic view illustrating the manner in which a positive color transparency may be superimposed upon a photochromic glass panel preparatory to exposure of the glass panel through the transparency;

FIG. 2 is a similar schematic view illustrating the manner in which the photochromic glass is darkened in the areas thereof corresponding to the less density areas of the associated positive color transparency; and FIG. 3 is a schematic view illustrating the manner in which the positive color transparency, photochromic glass panel and half-tone screen may be utilized in conjunction with an enlarger in order to expose a color transparency negative film sheet in accordance with the present invention.

DETAILED DESCRIPTION OF THE INVENTION

Referring now more specifically to FIG. 1, the numeral 10 generally designates a conventional form of enlarger, the numeral 12 designates a positive color transparency to be reproduced by color printing methods and the numeral 14 designates a planar panel of photochromic glass as manufactured by Corning Glass Works, of Corning, N.Y. This photochromic (sensitive) glass is produced in various grades. Photochromic glass darkens responsive to light of a given value incident thereon over a predetermined period of time.

Conventional methods of producing color separation negatives includes the use of a continuous tone negative transparency mask and a conventional half-tone screen and wherein the positive color transparency and a continuous tone negative transparency mask are placed in full registry with each other and utilized in conjunction with the half-tone screen in an enlarger in order to expose a color separation negative. However, considerable skill is required to produce the aforementioned continuous tone negative transparency mask and the mask and the positive color transparency must then be disposed in exact registry with each other and utilized in conjunction with the half-tone screen in order to produce a usable color separation negative. Nevertheless, a color separation negative produced through the utilization of a continuous tone negative transparency mask may have the midtones thereof excessively compressed and any misregistry between the continuous tone negative transparency mask and the positive color transparency results in a color separation negative which may not be used.

With the instant invention, the positive color transparency 12 is superposed directly on the glass panel 14 with the base side of the transparency 12 opposing the glass panel 14 and the transparency and glass panel are secured relative to each other against movement in any suitable manner in order to form a laminate-type assembly. The assembly is thereafter placed within the enlarger 10 for the purpose of "exposing" the glass panel 14 through the transparency 12. Of course, other means may be utilized to effect this "exposing" process. After the panel 14 has been exposed by light of suitable intensity and for a sufficient duration of time, those areas of the panel 14 corresponding to the less dense areas of the transparency 12 will be darkened and will remain darkened for the duration of the separations.

During this reasonable time, the assembly, including the transparency and the panel 14, while still inserted in the enlarger 10 may be utilized to expose a color separation negative film sheet 16 in the conventional manner through a half-tone screen 18, see FIG. 3.

By using the panel 14, the need to carefully prepare and use a continuous tone negative transparency mask is eliminated. Further, after the color separation negative film sheet has been exposed and developed in order to produce the desired color separation negative, the panel 14 may be placed in a darkened area for sufficient time to enable the panel 14 to be restored to its original state. Thus, the panel 14 may be used over and over and, as hereinbefore set forth, the panel 14 utilized may be selected from a set of panels of photochromic glass having different darkening qualities.

Although the need for "flashing" or "bumping" is substantially eliminated by the method of the instant invention, in some extreme cases conventional "flashing" or "bumping" may be carried out if desired in order to achieve specific end results.

The method of the instant invention is similar to the method disclosed in my co-pending U.S. application Ser. No. 101,017, filed Dec. 6, 1979, wherein a method of producing color separation negatives is disclosed which also does not require the use of a continuous tone negative transparency mask. In my co-pending application, the method disclosed involves less developing time and greater developer strength in developing the color separation negative. While this latter method constitutes a considerable improvement over the conventional method of producing a color separation negative wherein a continuous tone negative transparency mask is utilized, the method of the instant invention represents a further improvement over the method disclosed in my above-noted co-pending application.

In addition to being usable in conjunction with conventional enlarger produced color separation negatives, the method of the instant invention may also be used in conjunction with other types of equipment or methods where a mask is used with a transparency including the newer scanner type equipment for the production of color separation negatives.

The foregoing is considered as illustrative only of the principles of the invention. Further, since numerous modifications and changes will readily occur to those skilled in the art, it is not desired to limit the invention to the exact construction and operation shown and described, and accordingly, all suitable modifications and equivalents may be resorted to, falling within the scope of the invention.

What is claimed as new is as follows:

1. The method of preparing color separation negatives for color printing reproduction of a positive color transparency, said method including:
    (A) superposing the positive color transparency on a panel of photochromic (sensitive) glass to form a laminate-type assembly;
    (B) directing a beam of light through the assembly from the transparency side thereof with a beam intensity and for sufficient time duration to cause the more heavily illuminated portions of the glass panel to darken;
    (C) enlarger exposing a trial color separation negative film sheet through said assembly and a half-tone screen (independent of a mask), with sufficient exposure time and light intensity to properly expose those areas of the film sheet corresponding to the greater density detail areas of the transparency to be reproduced;
    (D) developing the trial film sheet with such developing time and developer strength to achieve the desired "dot size" in said areas as well as in the areas of the resultant trial color separation negative corresponding to the lesser dense areas of the color transparency.

2. The method of claim 1 wherein the base side of the color transparency faces the glass panel in step (A).

3. The method of claim 1 wherein step (C) is carried out by using a long range half-tone screen.

4. The method of preparing color separation negatives for color print reproduction of a positive color transparency, said method comprising:
    (A) inspection of the positive color transparency to determine the greater density detail areas to be reproduced;
    (B) superposing the positive color transparency on a panel of photochromic (sensitive) glass to form a laminate-type assembly;
    (C) directing a beam of light through the assembly from the transparency side thereof with a beam intensity and for sufficient time duration to cause the more heavily illuminated portions of the glass panel to darken;
    (D) exposing a trial color separation negative film sheet through said assembly and a half-tone screen (independent of a mask) with sufficient exposure time to properly expose those areas of the film sheet corresponding to the greater density detail areas of the transparency to be reproduced;
    (E) developing said trial film sheet with such developing time and developer strength to achieve the desired "dot size" in said areas as well as in the areas of the resultant trial color separation negative corresponding to the lesser dense areas of said color transparency.

5. The method of claim 4 including:
(F) enlarger exposing each desired color separation negative film sheet through a laminate-type assembly such as that formed in step (B) and exposed utilizing the same exposure time and beam intensity of step (C); and
(G) developing said desired color separation negative film sheets with the development time and developer strength determined in step (E).

* * * * *